(12) United States Patent  
Mizoguchi

(10) Patent No.: US 7,078,717 B2
(45) Date of Patent: Jul. 18, 2006

(54) LIGHT SOURCE DEVICE AND EXPOSURE EQUIPMENT USING THE SAME

(75) Inventor: Hakaru Mizoguchi, Hiratsuka (JP)

(73) Assignee: Gigaphoton Inc., Tokyo (JP)

( * ) Notice: Subject to any disclaimer, the term of this patent is extended or adjusted under 35 U.S.C. 154(b) by 71 days.

(21) Appl. No.: 10/806,812

(22) Filed: Mar. 22, 2004

(65) Prior Publication Data

US 2005/0205803 A1    Sep. 22, 2005

(51) Int. Cl.
*H01J 35/20*    (2006.01)

(52) U.S. Cl. ............... 250/504 R; 250/493.1; 378/119

(58) Field of Classification Search ............ 250/504 R, 250/493.1; 378/119
See application file for complete search history.

(56) References Cited

U.S. PATENT DOCUMENTS 5,577,092 A * 11/1996 Kublak et al. ............... 378/119
5,991,360 A * 11/1999 Matsui et al. ............... 378/119
6,862,339 B1 * 3/2005 Richardson ................. 378/119
6,882,704 B1 * 4/2005 Schriever et al. ........... 378/119

2004/0238762 A1 * 12/2004 Mizoguchi et al. ..... 250/504 R

FOREIGN PATENT DOCUMENTS

JP    2003-092199 A    3/2003

OTHER PUBLICATIONS

*Handbook of Laser*, Chapter 34, pp. 669-672; Laser Society of Japan, 1982, Ohm Press, Tokyo, Japan & partial translation.

* cited by examiner

*Primary Examiner*—Kiet T. Nguyen
(74) *Attorney, Agent, or Firm*—Frishauf, Holtz, Goodman & Chick, P.C.

(57) ABSTRACT

A light source device which has small etendue so that high power can be drawn out and which is subject to less damage by debris. The light source device for generating extreme ultra violet light by irradiating a target with a laser beam, includes a target supply unit for supplying a material which becomes the target; a laser unit including an oscillation stage laser having a lower-order transverse mode and at least one amplification stage laser for amplifying a lower-order transverse mode laser beam generated by the oscillation stage laser, for irradiating the target with the amplified laser beam to generate plasma; and a collection optical system for collecting the extreme ultra violet light emitted from the plasma to output the collected extreme ultra violet light.

20 Claims, 5 Drawing Sheets

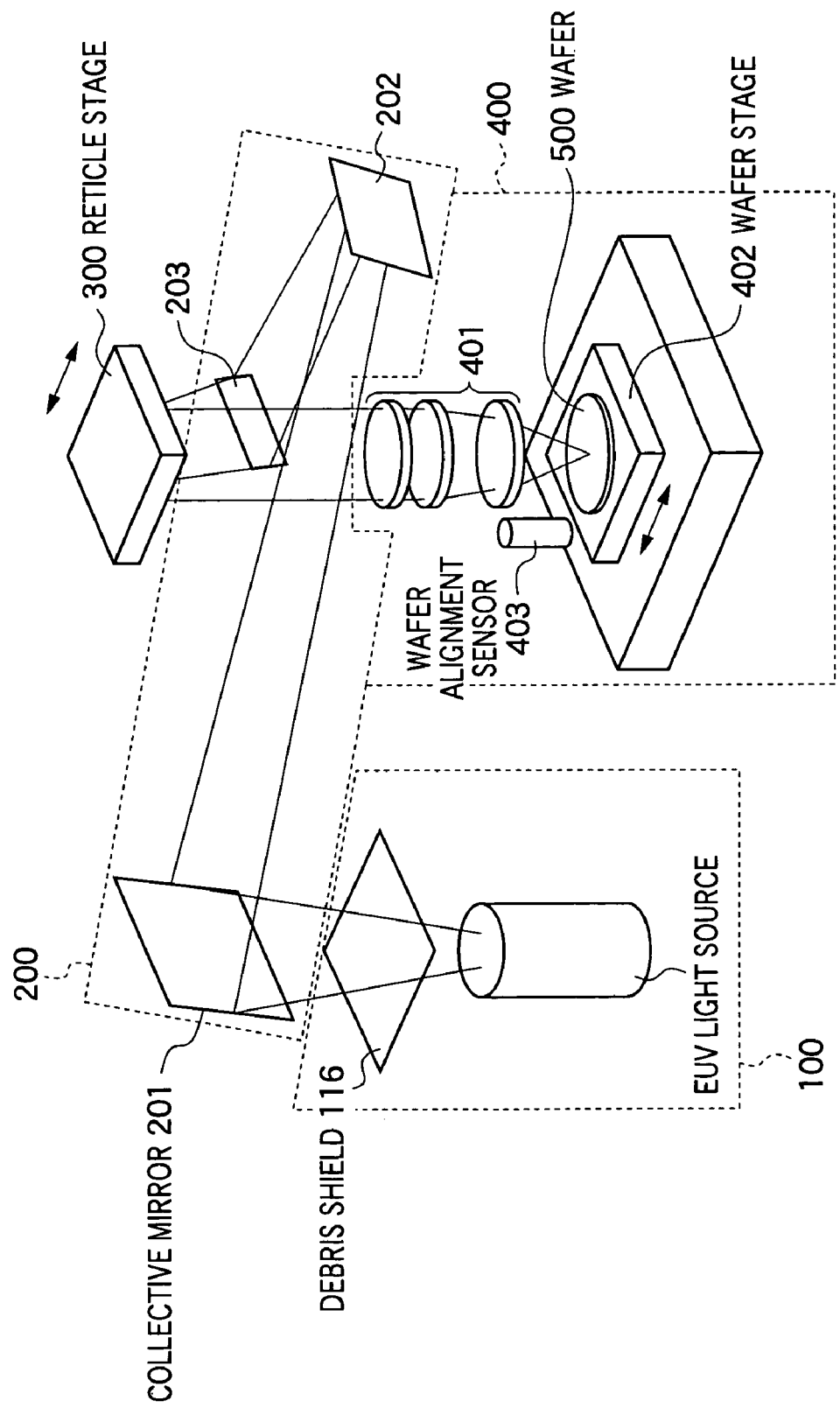

LIGHT SOURCE DEVICE AND EXPOSURE EQUIPMENT USING THE SAME

BACKGROUND OF THE INVENTION

1. Field of the Invention

The present invention relates to a light source device for generating extreme ultra violet (EUV) light by irradiating a target with a laser beam. Furthermore, the present invention relates to exposure equipment using such light source device.

2. Description of a Related Art

With miniaturization of the semiconductor process, the photolithography makes rapid progress in miniaturization, and, in the next generation, micro-fabrication of 100 nm to 70 nm, further, micro-fabrication of 50 nm or less will be required. For example, in order to fulfill the requirement for micro-fabrication of 50 nm or less, the development of exposure equipment with combination of an EUV light source for generating light having a wavelength of about 13 nm and a reduced projection catoptric system is expected.

EUV lithography is a kind of photolithography which uses extreme ultraviolet light having a wavelength range of 10 nm to form a circuit by forming a mask image of patterns of a semiconductor circuit onto a resist coated on a semiconductor wafer in the reduced projection catoptric system. In the exposure equipment to be used for EUV lithography, it is assumed that the throughput is 80 sheet/hour and the resist sensitivity is 5 mJ/cm$^2$, and, in the case of using the constitution of the optical system that is conceived at present, the EUV light source of about 10W to 1000W is required.

As the EUV light source, there are three kinds of light sources, that is, an LPP (laser produced plasma) light source using plasma generated by irradiating a target with a laser beam, a DDP (discharge produced plasma) light source using plasma generated by discharge, and an SR (synchrotron radiation) light source using orbital radiation. Among them, the LPP light source has advantages that extremely high intensity near black body radiation can be obtained because plasma density can be considerably made larger, light emission of only the necessary waveband can be performed by selecting the target material, and there is no structure such as electrodes surrounding the light source and an extremely large collection solid angle of $2\pi$ sterad can be ensured because it is a point source having substantially isotropic angle distribution, and therefore, the LPP light source is thought to be predominant as a light source for EUV lithography requiring power of about 10W to 1000W.

In the LPP light source, in the case where a solid material is used as a target which is irradiated with a laser beam for generating plasma, the heat generated by the laser beam irradiation is conducted to the periphery of the laser beam irradiated region, and the solid material is melted on the periphery thereof. The melted solid material is released in large quantity as debris having a diameter more than several micrometers, and that causes damage to a collective mirror to reduce the reflectance thereof. On the other hand, in the case where gas is used as the target, debris is reduced but the conversion efficiency from the power supplied to the laser oscillator into the power of EUV light is reduced.

By the way, since the LPP light source is a point source or a set of point sources, it is necessary to collect the light diverged from the LPP light source by using the collective mirror so as to output light available to the EUV lithography. Here, in luminous transmission of point source light, there exists a principle that etendue is always constant. The etendue is a quantity defined by the product of a luminous area and a spreading angle (solid angle). When the light source side etendue (the product of the light source area and the diverging solid angle) is larger than the illuminated region etendue (the product of the illuminated region and the solid angle of illumination light), the ratio of the luminous that can not be taken in the illuminated region is increased, and accordingly, the light source side etendue is needed to be suppressed smaller than the illuminated region etendue. Since the EUV light is diverging light, in order to suppress the etendue smaller, the size of plasma as the light source should be made sufficiently small. For example, in order to collect the light in a range from the light source to the solid angle $\pi$, the diameter of plasma is needed to be less than about 0.5 mm.

Conventionally, in order to generate plasma in the LPP light source, the development has been performed by using a 1.5W class LD excitation YAG laser. This YAG laser exhibits pulse duration of several nanoseconds and the wavelength of the laser beam to be used is in the 1 μm range. On the other hand, the generation process of the plasma exceeding several tens of thousands degrees is developed on a scale of picoseconds ($10^{-12}$ seconds). In the case where the plasma density is small at the initial time of irradiation of the laser beam, the laser beam subsequently passes through without turning molecules and atoms in the target into a plasma state sufficiently. On the contrary, in the case where the plasma density is too large, the laser beam is intercepted by the plasma on the side irradiated with the laser beam, the plasma having sufficient volume can not be generated. Accordingly, there is a suitable range for the target gas density.

When the YAG laser is used, it is necessary to allow the laser beam to interact with the target gas having rather large density for efficient absorption of the laser beam. Therefore, it is necessary to irradiate with the laser beam the gas having large density near the orifice of the nozzle. However, there are problems that the high-powered YAG laser is poor in collectivity because multiple modes exist in the transverse mode, which becomes deteriorated further because the non-uniformity of the glass medium increases due to heat generated during operation, and, as a result, the irradiation efficiency to the target is reduced.

SUMMARY OF THE INVENTION

The present invention has been achieved in view of the above-described problems. A first object of the present invention is to provide a light source device which has small etendue so that high power can be drawn out and which is subject to less damage by debris. Further, a second object of the present invention is to provide exposure equipment capable of realizing minute photolithography by using such light source device.

In order to solve the above-described problems, a light source device according to one aspect of the present invention is a light source device for generating extreme ultra violet light by irradiating a target with a laser beam, and the device including: a target supply unit for supplying a material which becomes the target; a laser unit including an oscillation stage laser having a lower-order transverse mode and at least one amplification stage laser for amplifying a lower-order transverse mode laser beam generated by the oscillation stage laser, for irradiating the target with the amplified laser beam so as to generate plasma; and a collection optical system for collecting the extreme ultra violet light emitted from the plasma to output the collected extreme ultra violet light.

Further, exposure equipment according to one aspect of the present invention includes: a light source device for generating extreme ultra violet light by irradiating a target with a laser beam, the light source device having a target supply unit for supplying a material which becomes the target, a laser unit including an oscillation stage laser having a lower-order transverse mode and at least one amplification stage laser for amplifying a lower-order transverse mode laser beam generated by the oscillation stage laser, for irradiating the target with the amplified laser beam so as to generate plasma, and a collection optical system for collecting the extreme ultra violet light emitted from the plasma to output the collected extreme ultra violet light; an illumination optical system for collecting the extreme ultra violet light generated by the light source device onto a mask using plural mirrors; and a projection optical system for exposing an object to light by using the extreme ultra violet light reflected from the mask.

According to the present invention constituted as described above, since the laser beam with high collectivity is generated by the oscillation stage laser having the lower-order transverse mode and amplified by the amplification stage laser and the target is irradiated with the amplified laser beam, the light source device can be provided which has small etendue so that high power can be drawn out and which is subject to less damage by debris. Furthermore, exposure equipment capable of realizing minute photolithography can be provided by using such light source device.

BRIEF DESCRIPTION OF THE DRAWINGS

FIG. 5 shows the constitution of exposure equipment according to the one embodiment of the present invention.

DESCRIPTION OF THE PREFERRED EMBODIMENTS

Figure 1:
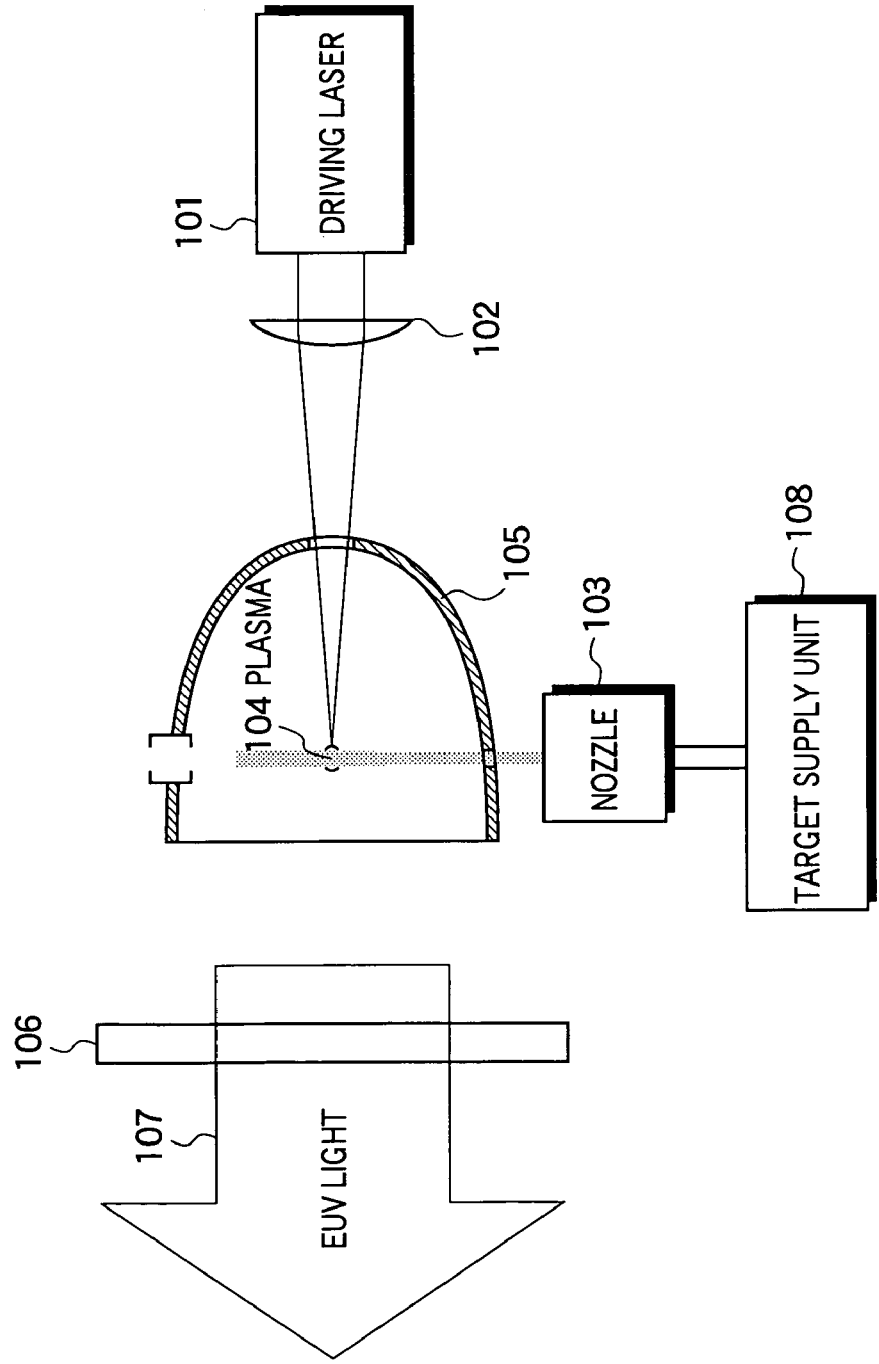
FIG. 1 is a sectional view showing the constitution of a light source device according to one embodiment of the present invention.

Hereinafter, an embodiment of the present invention will be described in detail by referring to the drawings. The same component elements are assigned with the same reference numerals and the description thereof will be omitted.

FIG. 1 shows the constitution of a light source device according to one embodiment of the present invention. This light source device includes a driving laser 101 for generating a laser beam as a laser unit and an optical system for collecting the laser beam generated by the driving laser 101. In this embodiment, the optical system is constituted by a collective lens 102. As the collective lens 102, a plano-convex lens or cylindrical lens is used.

Further, the light source device includes a target supply unit 108 for supplying a material which becomes a target to be irradiated with a laser beam, and a nozzle 103 for injecting the material supplied from the target supply unit 108. The laser unit irradiates with a laser beam the target supplied from the target supply unit, and thereby, plasma is generated.

Furthermore, the light source device includes a reflective mirror 105 constituting a collection optical system for collecting extreme ultra violet (EUV) light emitted from the plasma and outputting the collected light, a debris shield 106 for eliminating debris of more than several micrometers in diameter released from the periphery of the laser beam irradiated region and allowing only the EUV light to passing therethrough. As the reflective mirror 105, a parabolic mirror, a spherical mirror, or a spherical mirror having plural curvatures can be used. In the present invention, the EUV light has a wavelength from 5 nm to 50 nm.

In the present invention, as the target, any one of gas, liquid and solid can be used. Note that, a material is desirable which becomes a gas state at the time of laser beam irradiation, or immediately after irradiated with the laser beam. Specifically, a material in a gas state at normal temperature (20° C.) is applicable, for example, xenon (Xe), a mixture with xenon as the main component, argon (Ar), krypton (Kr), or water ($H_2O$) and alcohol which become a gas state in a low pressure condition can be used. Since the extreme ultra violet light generating unit is needed to be in a vacuum condition, even in the case where water is supplied at normal temperature, it becomes gas after coming out from the nozzle.

In the case where the material which becomes a target is initially in a gas state, the gas may be supplied remaining in the gas state by applying pressure to the gas to release the gas from the opening of the nozzle 103. Alternatively, the gas may be supplied as a jet of a cluster ion of electrically charged atoms or molecules produced by the cohesion of plural number of atoms or molecules with positive ions or negative ions as a core.

In this embodiment, xenon (Xe) is used as the target. In this case, the generated EUV light has a wavelength from about 10 nm to about 15 nm. The target supply unit 108 applies pressure to the xenon gas, and thereby, the xenon gas is jetted from the opening of the nozzle 103 toward above. The nozzle 103 has an opening in a slit form, or plural openings arranged in a line. Accordingly, the jetted xenon gas flows vertically with a broad width along longitudinal direction of the opening, and forms a column of the xenon gas.

The laser beam generated from the driving laser 101 is collected by the cylindrical collective lens 102 to become a laser beam having a substantially linear sectional shape and applied toward the xenon gas column. In a position where the applied laser beam intersects with the xenon gas, cigar-shaped plasma 104 having a length of several millimeters to several centimeters is generated.

The EUV light emitted from the plasma is collected by the reflective mirror 105 constituting the collection optical system to form collimated light 107. It is desired that the optical axis of the collection optical system is orthogonalized to the longitudinal axis of the plasma 104. The collimated light 107 passes through the debris shield 106 provided for elimination of debris, and then, supplied to an exposure unit.

The driving laser 101 includes an oscillation stage laser having a lower-order transverse mode and at least one amplification stage laser for amplifying a lower-order transverse mode laser beam generated by the oscillation stage laser. As below, specific examples of the driving laser 101 will be described in detail.

Figure 2:
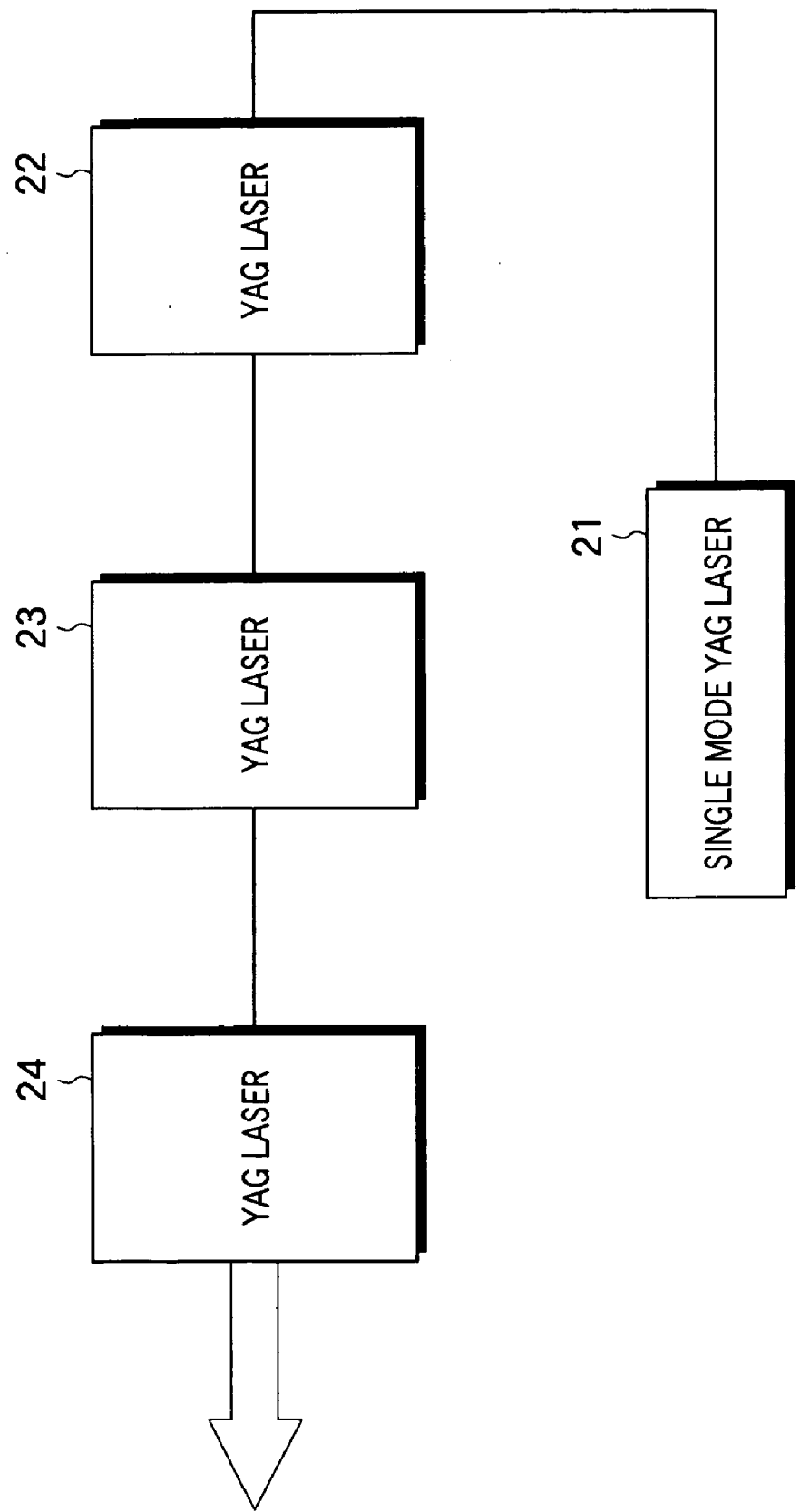
FIG. 2 shows a first specific example of a driving laser used in the one embodiment of the present invention.

FIG. 2 shows a first specific example of the driving laser to be used in this embodiment. In the first specific example, a laser of MOPA (master oscillator power amplifier) system is formed by connecting an oscillation stage YAG laser 21 and three amplification stage YAG lasers 22 to 24 serially. Here, the MOPA system laser is exemplified, however, a laser of injection locking system (ILS) may be used. The MOPA system is a system in which no reflective mirror is disposed on either of the rear side or front side of the amplification stage laser, and, in the amplification stage laser, no laser resonator is formed. On the other hand, the injection locking system is a system in which the reflective mirrors are disposed on both the rear side and front side of the amplification stage laser, and, in the amplification stage laser, a laser resonator is also formed. Even in the case where either system is adopted, when the lower-order transverse mode laser beam is emitted in the oscillation stage laser, the laser beam amplified and emitted by the amplification stage laser can also maintain the lower-order transverse mode, and thereby, the collectivity becomes higher. In the case where plural laser units are serially connected in the driving laser as described above, it is preferred that laser media thereof are of the same kind.

In the oscillation stage YAG laser 21, the single mode and the transverse mode are achieved by using an optical element such as an SBS (stimulated brillouin scattering) element or an adaptive optical element. The oscillation stage YAG laser 21 generates a laser beam having a wavelength of nearly 1 μm. Since the oscillation stage laser may be low-powered, the repeated oscillation at high frequencies up to about 10 kHz and the stabilization of beam modes can be intended relatively easily.

On the other hand, the amplification stage YAG lasers 22, 23, and 24 are high-powered lasers. The low-powered pulse light entered from the oscillation stage YAG laser 21 into the amplification stage YAG laser 22 is amplified while sequentially advancing through the high-powered YAG lasers 22, 23, and 24. Thereby, the necessary energy is obtained, and a laser beam having high collectivity and high energy is outputted from the high-powered YAG laser 24.

The size of the EUV light source is required to satisfy the restriction of etendue. This is because, if the size is larger than that, the ratio of luminous available for exposure is reduced, and the efficiency becomes low. Therefore, when a laser is used as the driving laser of the EUV light source, the diameter of the laser beam must be sufficiently small. In the present invention, since a laser having a lower-order transverse mode is used as the oscillation stage laser, the diameter of the laser beam can be made sufficiently small.

Figure 3:
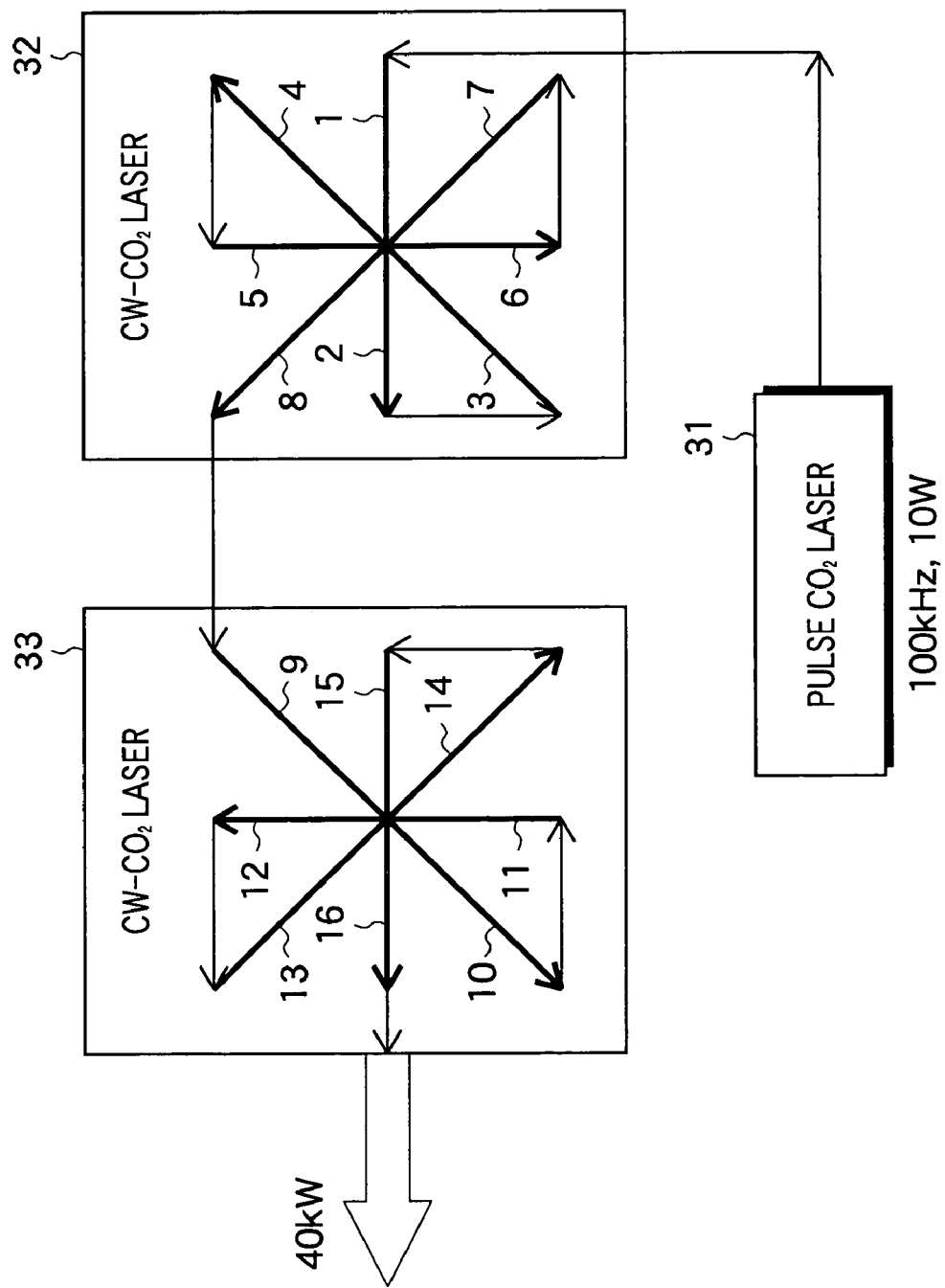
FIG. 3 shows a second specific example of a driving laser used in the one embodiment of the present invention.

FIG. 3 shows a second specific example of the driving laser used in this embodiment. In the second specific example, an MOPA system laser is formed by connecting three carbon dioxide lasers serially. Here, the MOPA system laser is exemplified, however, a laser of injection locking system (ILS) may be used.

As shown in FIG. 3, a pulse $CO_2$ laser 31 of 10W in output is disposed in the oscillation stage, and two CW (continuous wave)-$CO_2$ lasers 32 and 33 are disposed in the amplification stage. The pulse $CO_2$ laser 31 in the oscillation stage can generate pulse light at high repetitive frequency (for example, 100 kHz). In this example, the pulse $CO_2$ laser 31 in the oscillation stage operates in the transverse mode and the single mode and generates a laser beam having a wavelength of nearly 10 μm.

The CW-$CO_2$ laser 32 in the amplification stage includes eight carbon dioxide lasers 1 to 8 and the CW-$CO_2$ laser 33 in the amplification stage also includes eight carbon dioxide lasers 9 to 16. In FIG. 3, a state in which a laser beam passes through the carbon dioxide lasers is shown by arrows. The low-powered pulse light entered from the pulse $CO_2$ laser 31 in the oscillation stage into the CW-$CO_2$ laser 32 in the amplification stage is amplified while advancing through the carbon dioxide lasers 1 to 16, and a laser beam having high collectivity and high energy is outputted from the CW-$CO_2$ laser 33 in the amplification stage. In this embodiment, the laser beam of 10W outputted from the pulse $CO_2$ laser 31 in the oscillation stage is amplified to 40 kW and outputted from the CW-$CO_2$ laser 33 in the amplification stage.

Since the CW-$CO_2$ laser oscillates continuously, the repetitive frequency of the oscillation is dominated by the performance of the oscillation stage laser. This is advantageous in the case where the EUV light is outputted at high repetitive frequencies of 2 kHz, 4 kHz, 6 kHz, etc. However, the energy density of the outputted laser beam can not be made higher. By modulating the CW-$CO_2$ lasers 32 and 33 in the amplification stage in synchronization with the pulse $CO_2$ laser 31 in the oscillation stage, waste excitation energy is saved and the system efficiency can be improved.

In the light source device as shown in FIG. 1, by using the $CO_2$ laser as the driving laser, the EUV light can be generated by irradiating the target with a laser beam having a long wavelength in a low density gas state. Accordingly, the distance from the opening of the nozzle 103 to the plasma 104 can be taken rather longer, and thereby, the problem of the damage and heat to the nozzle by the plasma can be reduced and the life of the reflective mirror can be made longer by suppressing the occurrence of debris. Further, since the distance between the opening of the nozzle and the position where the plasma is generated can be separated, the design relating to the arrangement of the collection optical system for drawing out the EUV light becomes easier.

Figure 4:
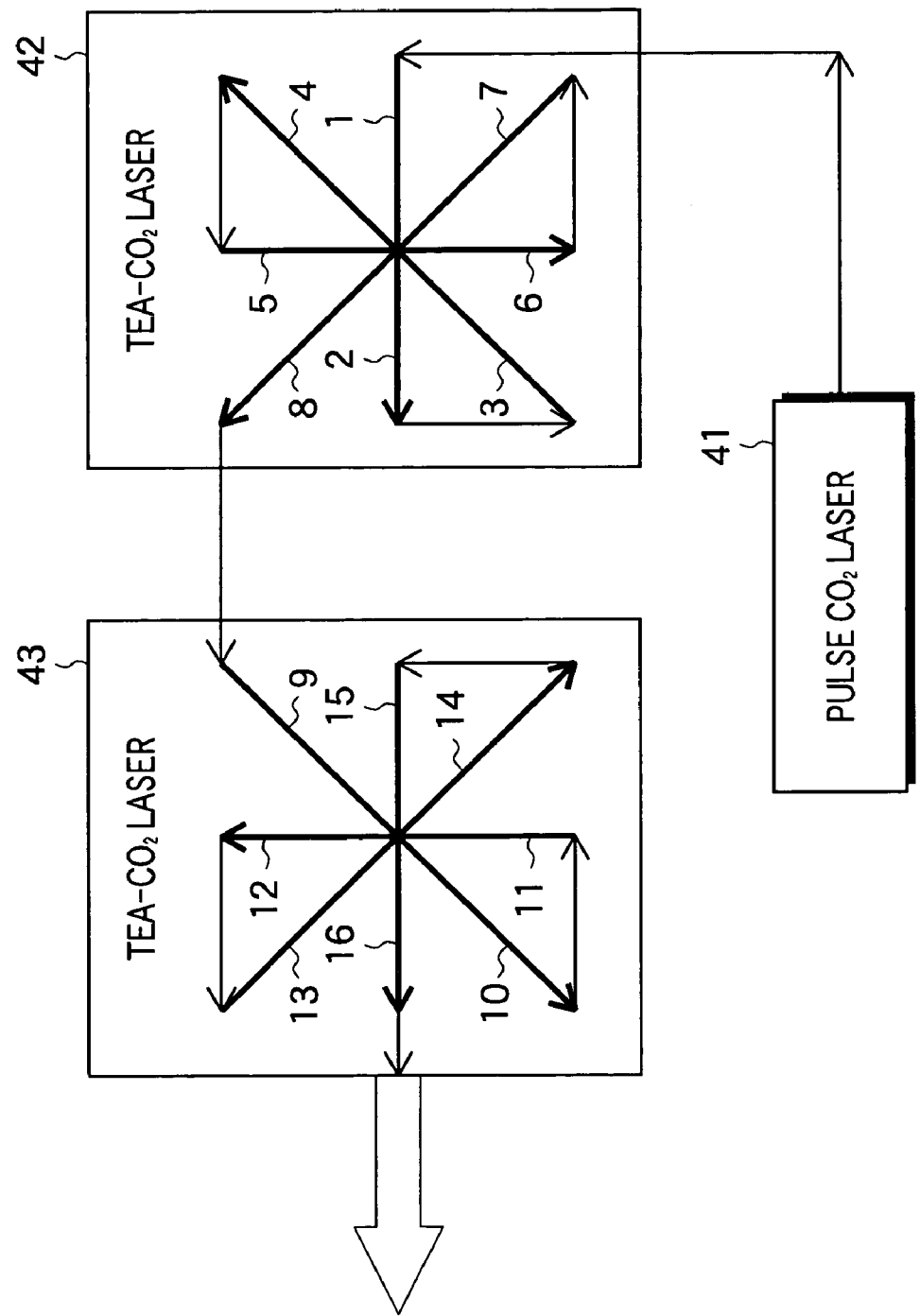
FIG. 4 shows a third specific example of a driving laser used in the one embodiment of the present invention.

FIG. 4 shows a third specific example of the driving laser used in this embodiment. In the third specific example, the CW-$CO_2$ lasers in the amplification stage in the second specific example are replaced with TEA (transversely excited atmospheric)-$CO_2$ lasers as pulse oscillation lasers. The TEA laser is a coherent light source that performs electrical discharge intersecting with the optical axis within the mixed gas at pressure reaching several atmospheres in order to obtain population inversion and gain and has a broad wavelength range from infrared to ultraviolet.

As shown in FIG. 4, a pulse $CO_2$ laser 41 is disposed in the oscillation stage, and two TEA-$CO_2$ lasers 42 and 43 are disposed in the amplification stage. In this case, since the repetitive frequency of the oscillation is dominated by the performance of the TEA-$CO_2$ lasers, the repetitive frequency is difficult to be made higher, however, the peak value of the energy of the outputted laser beam can be made higher.

Next, exposure equipment according to the one embodiment of the present invention will be described. FIG. 5 shows the constitution of the exposure equipment according to the one embodiment of the present invention. This exposure equipment uses the light source device as described above, and, since the debris in the light source is little, the adverse effect on the optical system can be reduced.

As shown in FIG. 5, the exposure equipment includes a light source device 100 for generating EUV light, an illumination optical system 200 for collecting the EUV light generated by the light source device 100 onto a reticle (mask) mounted on a reticle stage 300 by using plural mirrors, and a projection optical system 401 for exposing an object to light by using the EUV light reflected from the mask. An exposure unit 400 is constituted by the projection optical system 401, a wafer stage 402 for placing a wafer thereon and a wafer alignment sensor 403 for detecting the position of a wafer 500. The entire exposure equipment is installed within a vacuum system that is maintained at low pressure by a vacuum pump or the like.

Next, the operation of the exposure equipment according to this embodiment will be described.

The light source device 100 outputs EUV light having sufficiently small etendue and high energy. Therefore, the ratio of the luminous available for exposure is high, and also the efficiency is high. The illumination optical system 200 collects the EUV light outputted from the light source device 100 onto the reticle stage 300 by using collective mirrors 201, 202, and 203. Thus, the illumination optical system 200 is constituted entirely by reflective systems, and the total reflectance is about 0.65.

To the lower side of the reticle stage 300 in the drawing, the mask on which a desired pattern is formed is attached, and the mask reflects the EUV light entered from the illumination optical system 200 according to the formed pattern. The projection optical system 401 provided in the exposure unit 400 projects the EUV light reflected by the mask onto a resist coated to the wafer 500 on the wafer stage 402 and exposes the resist to the light. Thereby, the pattern on the mask can be reduced in size and transferred to the resist on the wafer. The reticle stage 300 and the wafer stage 402 are movable perpendicular relative to the optical axis, and, by moving the reticle stage 300 and the wafer stage 402, the entire mask pattern is exposed to light.

As described above, according to the present invention, since the laser beam with high collectivity generated by the oscillation stage laser having the lower-order transverse mode is amplified by the amplification stage laser and applied to the target, the light source device can be provided which has small etendue so that high power can be drawn out and which is subject to less damage by debris. Furthermore, exposure equipment capable of realizing minute photolithography can be provided by using such light source device.

The invention claimed is:

1. A light source device for generating extreme ultraviolet light by irradiating a target with a laser beam, said device comprising:
   a target supply unit for supplying a material which becomes said target;
   a laser unit, which includes an oscillation stage including a laser for generating a laser beam in both a lower-order transverse mode and a single mode and at least one amplification stage for amplifying the laser beam generated by said oscillation stage, for irradiating said target with the amplified laser beam so as to generate plasma; and
   a collection optical system for collecting extreme ultraviolet light emitted from said plasma to output the collected extreme ultraviolet light.

2. The light source device according to claim 1, wherein said laser unit comprises an MOPA (master oscillator power amplifier) system in which the amplification stage does not include a laser resonator.

3. The light source device according to claim 2, wherein each of said oscillation stage and said at least one amplification stage includes a YAG laser.

4. The light source device according to claim 3, wherein said at least one amplification stage includes a high-powered YAG laser.

5. The light source device according to claim 2, wherein each of said oscillation stage and said at least one amplification stage includes a carbon dioxide laser using as a laser medium a mixed gas including carbon dioxide gas.

6. The light source device according to claim 5, wherein said at least one amplification stage includes a CW (continuous wave) carbon dioxide laser.

7. The light source device according to claim 5, wherein said at least one amplification stage includes a TEA (transversely exited atmospheric) carbon dioxide laser.

8. The light source device according to claim 1, wherein said laser unit comprises an injection locking system (TLS) in which the amplification stage includes a laser resonator.

9. The light source device according to claim 8, wherein each of said oscillation stage and said at least one amplification stage includes a YAG laser.

10. The light source device according to claim 3, wherein each of said oscillation stage and said at least one amplification stage includes a carbon dioxide laser using as a laser medium a mixed gas including carbon dioxide gas.

11. The light source device according to claim 1, wherein each of said oscillation stage and said at least one amplification stage includes a YAG laser.

12. The light source device according to claim 11, wherein said oscillation stage includes a single mode YAG laser.

13. The light source device according to claim 11, wherein said at least one amplification stage includes a high-powered YAG laser.

14. The light source device according to claim 1, wherein each of said oscillation stage and said at least one amplification stage includes a carbon dioxide laser using as a laser medium a mixed gas including carbon dioxide gas.

15. The light source device according to claim 14, wherein said oscillation stage includes a pulse carbon dioxide laser.

16. The light source device according to claim 14, wherein said at least one amplification stage includes a CW (continuous wave) carbon dioxide laser.

17. The light source device according to claim 14, wherein said at least one amplification stage includes a TEA (transversely exited atmospheric) carbon dioxide laser.

18. Exposure equipment comprising:
   a light source device for generating extreme ultraviolet light by irradiating a target with a laser beam, said light source device comprising: (i) a target supply unit for supplying a material which becomes said target, (ii) a laser unit, which includes an oscillation stage including a laser for generating a laser beam in both a lower-order transverse mode and a single mode and at least one amplification stage for amplifying the laser beam generated by said oscillation stage, for irradiating said target with the amplified laser beam so as to generate plasma, and (iii) a collection optical system for collecting extreme ultraviolet light emitted from said plasma to output the collected extreme ultraviolet light;
   an illumination optical system for collecting the extreme ultraviolet light generated by said light source device onto a mask by using a plurality of mirrors; and
   a projection optical system for exposing an object to light by using the extreme ultraviolet light reflected from said mask.

19. The exposure equipment according to claim 18, wherein said laser unit of said light source device comprises an MOPA (master oscillator power amplifier) system in which the amplification stage does not have a laser resonator.

20. The exposure equipment according to claim 18, wherein said laser unit of said light source device comprises an injection locking system (ILS) in which the amplification stage includes a laser resonator.

* * * * *

UNITED STATES PATENT AND TRADEMARK OFFICE
CERTIFICATE OF CORRECTION

| | |
|---|---|
| PATENT NO. | : 7,078,717 B2 |
| APPLICATION NO. | : 10/806812 |
| DATED | : July 18, 2006 |
| INVENTOR(S) | : Hakaru Mizoguchi |

Page 1 of 1

It is certified that error appears in the above-identified patent and that said Letters Patent is hereby corrected as shown below:

Col. 8 line 8, change "(TLS)" to -- (ILS) --.
Col. 8 line 13, change "claim 3" to -- claim 8 --.

Signed and Sealed this

Nineteenth Day of February, 2008

JON W. DUDAS
*Director of the United States Patent and Trademark Office*